United States Patent
Yang

(10) Patent No.: US 7,514,333 B2
(45) Date of Patent: Apr. 7, 2009

(54) CMOS POWER SENSOR

(75) Inventor: Hung-Ming Yang, Tainan (TW)

(73) Assignee: Himax Technologies Limited (TW)

( * ) Notice: Subject to any disclaimer, the term of this patent is extended or adjusted under 35 U.S.C. 154(b) by 499 days.

(21) Appl. No.: 11/302,807

(22) Filed: Dec. 14, 2005

(65) Prior Publication Data

US 2006/0094152 A1  May 4, 2006

Related U.S. Application Data

(62) Division of application No. 10/916,717, filed on Aug. 13, 2004, now Pat. No. 7,091,562.

(51) Int. Cl.
*H01L 27/22* (2006.01)
*H01L 43/04* (2006.01)

(52) U.S. Cl. .............. 438/308; 438/3; 438/795

(58) Field of Classification Search ........................ None
See application file for complete search history.

(56) References Cited

U.S. PATENT DOCUMENTS 6,639,299 B2 * 10/2003 Aoki .......................... 257/531
2005/0106758 A1 * 5/2005 Fukumoto et al. ........... 436/526

* cited by examiner

*Primary Examiner*—Zandra Smith
*Assistant Examiner*—Pamela E Perkins
(74) *Attorney, Agent, or Firm*—Baker & McKenzie LLP

(57) ABSTRACT

A CMOS power sensor is disclosed in the present invention. The CMOS power sensor includes a current coil, a high voltage device circuit, and a Hall device. The current coil is fabricated during the process steps of forming gold bumps of a CMOS device. One end of the current coil is connected to a voltage source, and the other end of the current coil is connected to a load. The high voltage device circuit is connected to the voltage source. The Hall device is connected to the high voltage device circuit and induces a Hall voltage in response to the magnetic field generated by the current coil.

8 Claims, 5 Drawing Sheets

CMOS POWER SENSOR

CROSS-REFERENCE TO RELATED APPLICATIONS

This application is a divisional of U.S. application Ser. No. 10/916,717, filed Aug. 13, 2004.

BACKGROUND OF THE INVENTION

1. Field of the Invention

The present invention generally relates to a CMOS power sensor, and more particularly to a CMOS power sensor having a current coil which is fabricated during the process steps of forming gold bumps of a CMOS device.

2. Description of the Related Art

A Hall device is a voltage generator based on the famous Hall effect to give an output voltage proportional to the magnitude of an external magnetic field. The Hall effect was discovered by E. H. Hall in 1879. When an electric current flows through a conducting material in a magnetic field, the charge carriers of the electric current will be pushed to one side of the conducting material by the transverse force induced by the magnetic field. Hall found that a measurable voltage would be induced between the two sides of the conducting material.

The conventional Hall devices are generally applied to detect the magnitude of an external magnetic fields. For example, the Hall device can be used in the computer keyboards, where pushing a key moves a permanent magnet toward the Hall device. The Hall device detects the change of the magnetic flex of the permanent magnet, and induces a Hall voltage which can be detected by the computers.

In addition, when located near a current coil, the Hall device will be subjected to the magnetic field which is generated proportional to the current magnitude flowing in the current coil. Therefore, the Hall voltage generated by the Hall device will be in proportion to the magnitude of the current flow in the current coil. For this reason, the Hall device can also be applied to detect the current magnitude of an input voltage source, and also to detect the power magnitude of an input voltage source.

Recently, research was dedicated to developing solid state micro-sensors based on the CMOS process for the detection of the current magnitude or power magnitude of an input voltage source. Hong-Ming Yang et al. developed a MOS magnetic current sensor based on standard CMOS process, which was published at ELECTRONICS LETTERS, 27th Match 1997, Vol. 33 No. 7. In that letter, they reported a current sensor based on standard CMOS processing. The current sensor has a high sensitivity owing to its current coil, fabricated on the second metal layer, being very close to the magnetic sensing MOS device underneath. The current coil has thus the same material with the second metal layer, i.e. aluminum (Al).

However, one disadvantage of using aluminum to form the current coil is that aluminum has a relatively high electric resistance. An Al-made current coil will result in a relatively large voltage drop, and will thus change many electric properties of MOS devices. This problem is particularly serious in low-voltage devices, where even a small voltage drop can have a profound effect on the devices.

Therefore, it is important for the IC-related industries to invent a new type of current sensor or power sensor, which contains a current coil made of a material having relatively low electric resistance, in order to achieve a relatively low voltage drop at the current coil and minimize the effects on the electric properties of the MOS devices.

SUMMARY OF THE INVENTION

One of the main purposes of the present invention is to disclose a CMOS power sensor, which is applied to detect the power magnitude of a given voltage source. One of the key features of the CMOS power sensor is that its current coil is fabricated during the process steps of forming the gold bumps of the CMOS devices, without any additional process step. In accordance with the present invention, the photo mask for the lithography process to form gold bumps needs to add the pattern to form the current coil, in order that the current coil can be fabricated simultaneously together with the gold bumps.

Another purpose of the present invention is to disclose a process of forming a CMOS power sensor. One of the key features of the process is that its current coil is fabricated during the process steps of forming the gold bumps of the CMOS devices, without any additional process step. In accordance with the present invention, the photo mask for the lithography process to form gold bumps needs to add the pattern to form the current coil, in order that the current coil can be fabricated simultaneously together with the gold bumps.

The present invention discloses a CMOS power sensor, which is applied to detect the power magnitude of a given voltage source. The CMOS power sensor includes a current coil, a high voltage device circuit, and a Hall device. The current coil is fabricated during the process steps of forming a plurality of gold bumps of CMOS devices. In addition, the current coil is connected to the voltage source and a load, and the high voltage device circuit is connected to the voltage source. The Hall device is connected to the high voltage device circuit and induces a Hall voltage in response to a magnetic field generated by the current coil.

The Hall device includes a first terminal, a second terminal, a third terminal, and a fourth terminal. The first terminal is connected to a high voltage device circuit, and the second terminal is connected to a ground. In addition, the third terminal is connected to a first Hall probe, and the fourth terminal is connected to a second Hall probe. The Hall voltage is the voltage difference between the first Hall probe and the second Hall probe.

The present invention further discloses a process of forming a CMOS power sensor, wherein the CMOS power sensor is applied to detect the power magnitude of a given voltage source. According to the present invention, a semiconductor wafer with a Hall device and a plurality of CMOS devices is first provided. On the top of the semiconductor wafer is a passivation layer which covers a plurality of bonding pads. After opening a contact window over each bonding pad by a conventional photolithography process and an etching process, a photo resist layer is coated on the semiconductor wafer. According to one embodiment of the present invention, a pad layer is optional to be formed on the whole semiconductor wafer before coating the photo resist layer.

After that, the photo resist layer is patterned by using a photo mask during an exposure process. It is worth noting that the photo mask includes patterns to form a plurality of gold bumps and a current coil. In addition, the current coil is connected to the voltage source and able to induce a magnetic field which can induce the Hall device to generate a Hall voltage.

Thereafter, the gold bumps and the current coil are formed by an electroplating process. After removing the residual photo resist by performing a stripping process, a part of the pad layer under the residual photo resist is also removed by an etching process. Finally, an anneal process is performed to form the CMOS power sensor.

BRIEF DESCRIPTION OF THE DRAWINGS

The objects and advantages of the present invention will be apparent from the following detailed description of the preferred embodiments of the invention with references to the following drawings.

DETAILED DESCRIPTION OF THE EMBODIMENT(S)

As mentioned above, it is necessary to develop a new type of power sensor containing a low-electric-resistance current coil, in order to achieve a relatively low voltage drop at the current coil. It is well-known that the metal material having the lowest electric resistance is gold. The present invention thus discloses a new power sensor containing a current coil made of gold, in order that the lowest voltage drop at the current coil can be achieved. The low voltage drop means that the electric characteristic of the CMOS devices will not be substantially influenced due to the existence of the current coil.

One of the preferred embodiments of the present invention is that the current coil is fabricated during the process steps of forming the gold bumps. Hence, no additional processing step is needed to fabricate the current coil, and thus the manufacture cost can be lowered down.

Another preferred embodiment of the present invention could use other suitable low electric resistance materials to replace gold, to match the materials of various metal bumps. The low electric resistance materials can be silver, copper, their alloy, or their alloy with gold.

Figure 1:
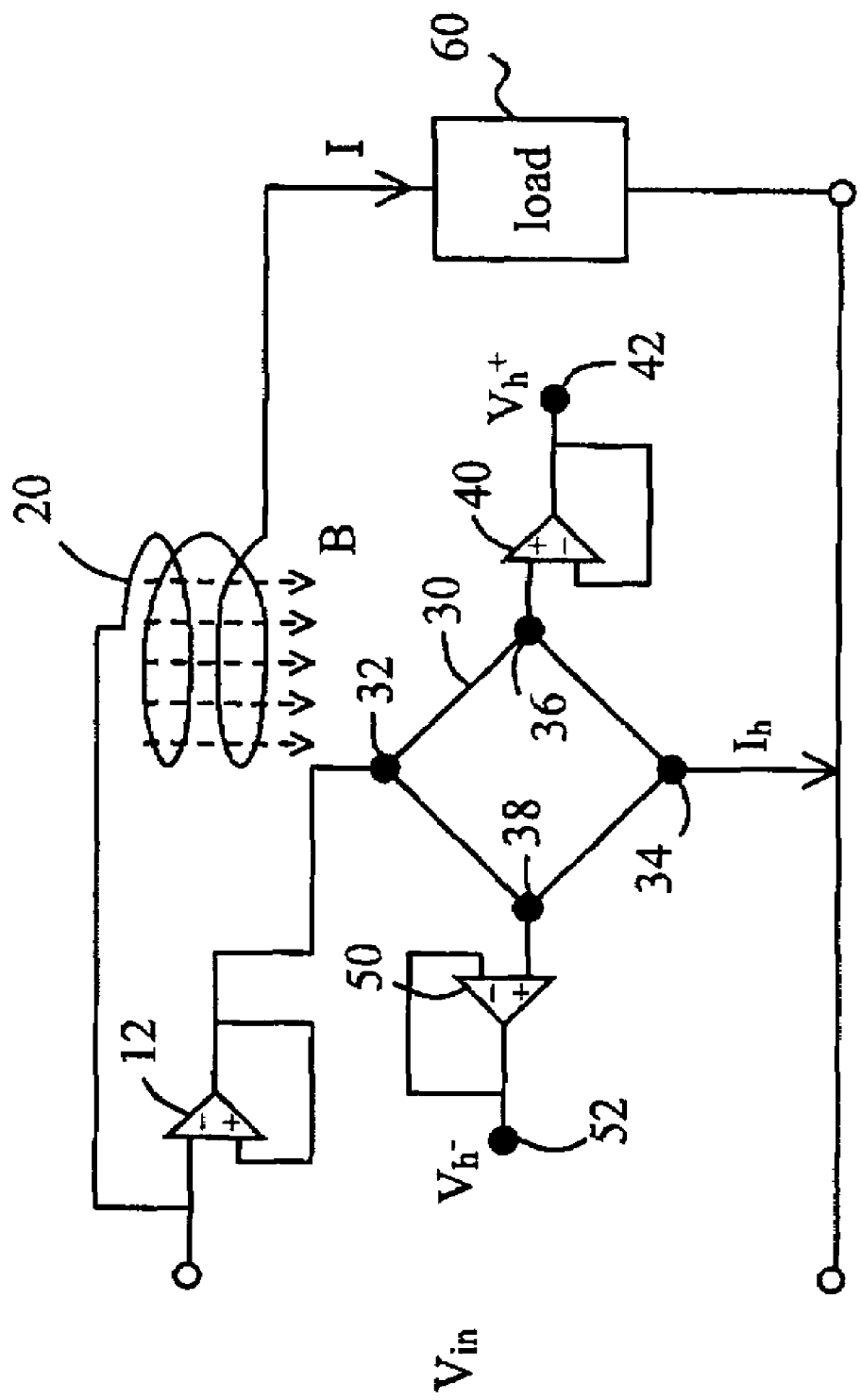
FIG. 1 shows a schematic circuit diagram in accordance with the present invention.

Please refer first to FIG. 1, which shows a schematic circuit diagram in accordance with the present invention. An input voltage source 10 is coupled to a high voltage device circuit 12 and to a current coil 20. The current coil 20 is further connected to a load 60, and the high voltage device circuit 12 is further connected to a Hall device 30.

The Hall device 30 can be made of a four-well device, a P-type MOS transistor, or an N-type MOS transistor. The Hall device 30 generally contains four terminals, i.e. a first terminal 32, a second terminal 34, a third terminal 36, and a fourth terminal 38. The first terminal 32 is connected to a high voltage device circuit 12, and the second terminal 34 is connected to a ground. The third terminal 36 is connected to a first Hall probe 42 through a first buffer 40, and the fourth terminal 38 is connected to a second Hall probe 52 through a second buffer 50. According to one embodiment of the present invention, the first buffer 40 and the second buffer 50 are optional.

When an electric current flows through the current coil 20, a magnetic field will be induced and detected by the Hall device 30. The voltage generated at the first Hall probe 42 is shown as Vh+, and the voltage generated at the second Hall probe 52 is shown as Vh−.

Figure 2:
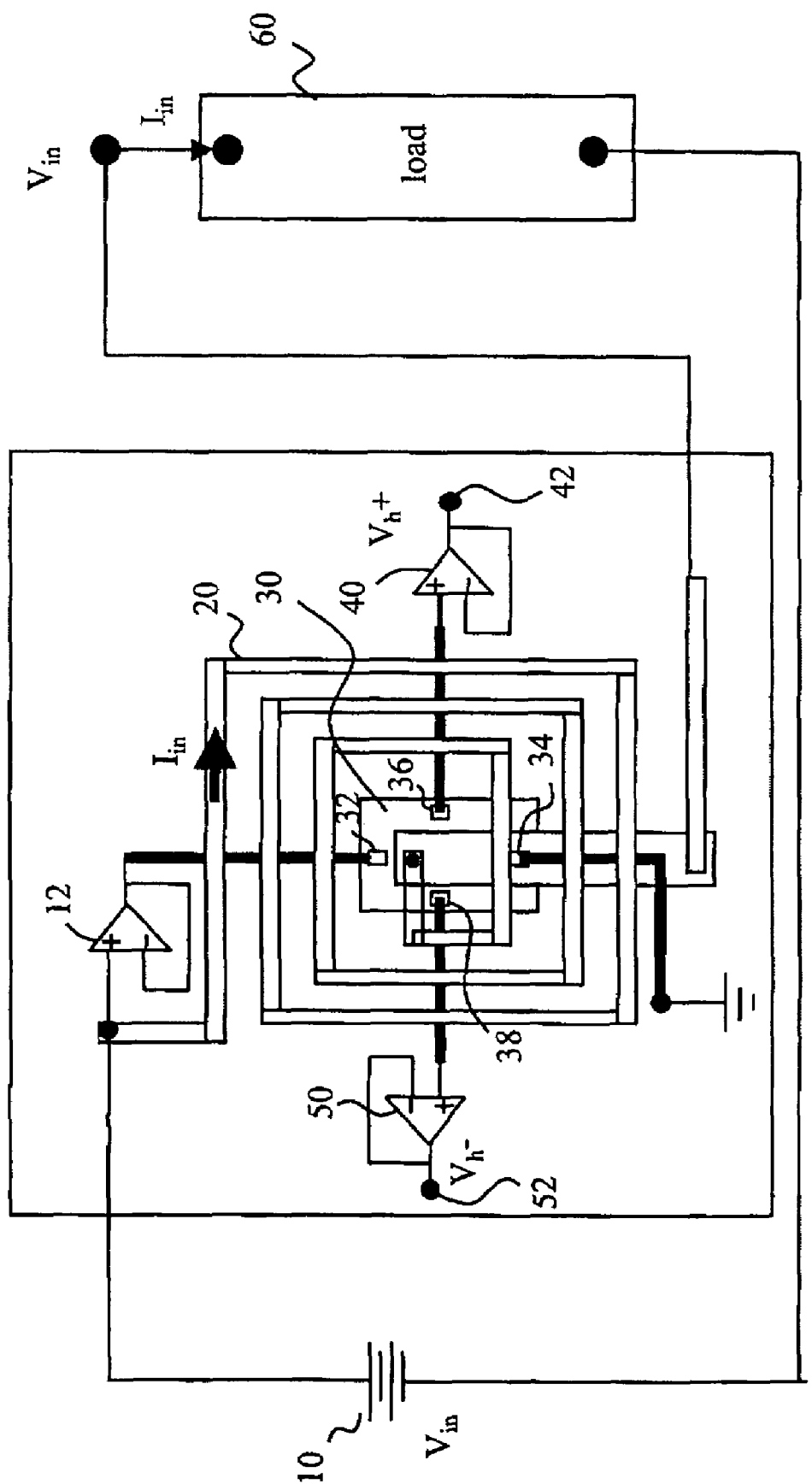
FIG. 2 shows a schematic top-view diagram in accordance with the present invention.

Please refer next to FIG. 2, which shows a schematic top-view diagram according to the present invention. FIG. 2 also shows that an input voltage source 10 is coupled to a high voltage device circuit 12 and to a current coil 20. The current coil 20 is further connected to a load 60, and the high voltage device circuit 12 is further connected to a Hall device 30. A first terminal 32 of the Hall device 30 is connected to the high voltage device circuit 12, and a second terminal 34 of the Hall device 30 is connected to a ground. A third terminal 36 of the Hall device 30 is connected to a first Hall probe 42 through a first buffer 40, and a fourth terminal 38 of the Hall device 30 is connected to a second Hall probe 52 through a second buffer 50.

It should be noting that the Hall device 30 is fabricated beneath the current coil 20. Once an electric current flows through the current coil 20, a magnetic field is generated and can be detected by the Hall device 30 underneath. The voltage generated at the first Hall probe 42 is also shown as Vh+, and the voltage created at the second Hall probe 52 is again shown as Vh−.

Figure 3:
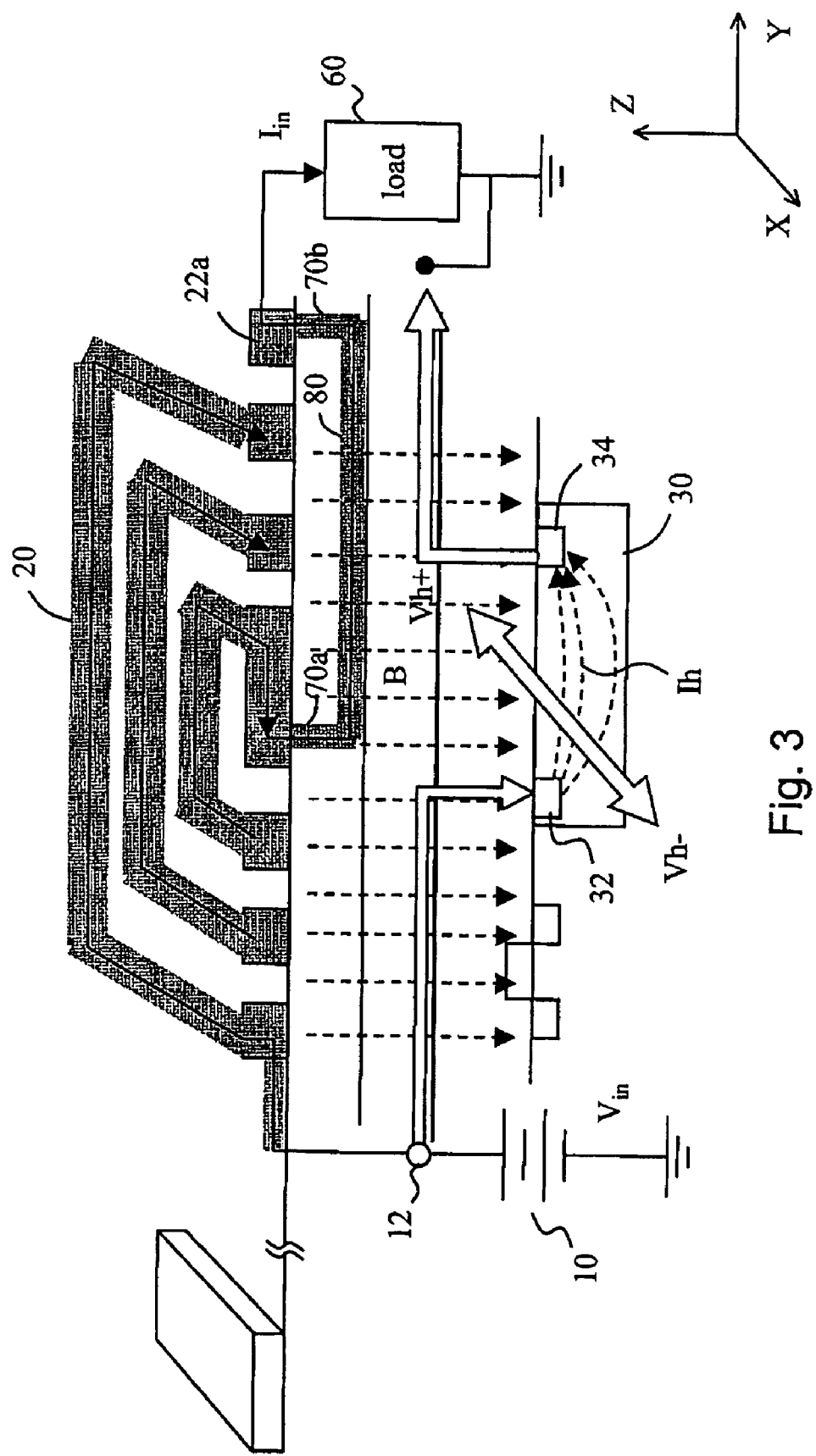
FIG. 3 shows another schematic cross-sectional diagram in accordance with the present invention.

Please refer next to FIG. 3, which shows another schematic cross-sectional diagram in accordance with the present invention. FIG. 3 also shows that an input voltage source 10 is coupled to a high voltage device circuit 12 and to a current coil 20. The high voltage device circuit 12 is further connected to a Hall device 30. A first terminal 32 of the Hall device 30 is connected to the high voltage device circuit 12, and a second terminal 34 of the Hall device 30 is connected to a ground.

It is worth noting that the current coil 20 is further connected to a load 60. The current coil 20 is first connected to a first plug 70a, and then the first plug 70a is connected to a top metal layer 80. The top metal layer 80 is connected to a second plug 80b, which is coupled to a gold bump 22a. The gold bump 22a is then connected to a load 60.

One feature of the present invention is that the Hall device can be readily integrated with other standard CMOS circuits without any additional process step. The Hall device 30 can be a four-well device, a P-type MOS transistor or an N-type MOS transistor, in accordance with the corresponding CMOS process steps.

One of the key features of the present invention is that the current coil 20 is fabricated during the process steps of forming the gold bumps without any additional process step. In accordance with the present invention, the photo mask for the lithography process forming the gold bumps needs to add the pattern to form the current coil 20, in order that the current coil 20 can be fabricated together with the gold bumps 22. Because no additional process step is needed to fabricate the current coil, the manufacture cost can be lowered.

Because the current coil 20 is manufactured together with the gold bumps 22, the current coil 20 is also made of gold material, which is a metal material with the lowest electric resistance. The low-electric-resistance characteristic of the current coil 20 means it has good electric conductivity and thus low voltage drop. The low voltage drop means that the existence of the current coil will not substantially influence the electric characteristics of the CMOS devices. Because a specific voltage drop will cause negative influence, especially on the low-voltage devices, this advantage of low voltage drop is particularly important for the low-voltage devices.

The current coil 20 is fabricated on the X-Y plane shown in FIG. 3. Once an electric current flows through the current coil 20, a magnetic field in the direction of Z-axis will be generated. Because the Hall device current (shown as Ih) between the first terminal 32 and the second terminal 34 of the Hall device 30 flows in the direction of Y-axis, the generated Hall voltage is in the direction of X-axis. It is worth noting that the high voltage device circuit 12 works as a voltage follower, in order that the input current provided by the input voltage source 10 doesn't flow into the Hall device 30, and the Hall device current changes in accordance with the voltage change of the input voltage source 10.

The voltage generated at the first Hall probe 42 is again shown as Vh+, and the voltage created at the second Hall probe 52 is again shown as Vh−. The Hall voltage (VHall) is the voltage difference between Vh+ and Vh−, shown as the following formula:

$$V\text{Hall}=(Vh+)-(Vh-)=G*(Ih*BI)/(q*n*t).$$

In the above formula, "G" represents a geometric parameter, "Ih" means Hall device current, "n" is the carrier concentration of the Hall device, "t" means the conducting thickness of the Hall device, and "BI" is the induced magnetic field generated by the electric current.

The electric resistance (Rn) of the Hall device multiplied by the Hall device current (Ih) should be the input voltage (Vin) of the input voltage source, shown as the following formula: Vin=Ih*Rn.

In addition, the induced magnetic field (BI) is proportional to the permeability ($\mu$), the number of the current coil (N), and the input current (I), shown as the following formula: BI=k*$\mu$*N*I. Therefore, the input current (I) can be shown as I=BI/(k*$\mu$*N).

The input current (I) multiplied by the input voltage (Vin) is the power (P) provided by the input voltage source 10. The equation of the power (P) can be shown as the follows:

$$P=Vin*I=(Ih*Rn)*(BI/(k*\mu*N))=(Ih*BI)*(Rn/(k*\mu*N))$$

This equation shows that the power (P) provided by the input voltage source 10 is proportional to the Hall voltage (VHall). For this reason, the power (P) provided by the input voltage source 10 can be precisely detected by measuring the Hall voltage (VHall) of the CMOS power sensor disclosed in the present invention.

Please refer then to FIGS. 4A-4F, which show schematic cross-sectional diagrams of a perferred process steps of forming the gold bumps and the current coil in a single step in accordance with the present invention. For simplicity, only one gold bump is shown on FIGS. 4A-4F.

One of the key features of the present invention is that the current coil is fabricated during the process steps of forming the gold bumps. Hence, no additional processing step is needed to fabricate the current coil. The process steps of forming the gold bumps and the current coil in a single step can be applied to any kinds of semiconductor process with gold bumps. FIGS. 4A-4F show one of the preferred embodiments disclosed in the present invention.

Figure 4A:
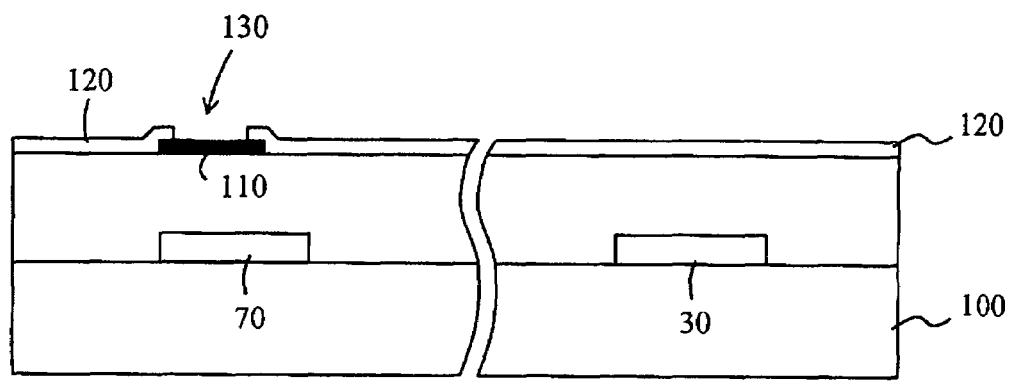
FIG. 4 show schematic cross-sectional diagrams of the process steps of forming the gold bumps and the current coil together in accordance with the present invention.

First referring to FIG. 4A, a semiconductor wafer 100 having a plurality of CMOS devices 70 and a Hall device 30 is prepared. For simplicity, only one CMOS device 70 is shown on FIG. 4A. On the semiconductor wafer 100, a plurality of bonding pads 110 made of Al, Cu or other metals are formed. For simplicity, only one bonding pad 110 is shown. The bonding pad 110 is connected to the top metal layer (not shown) through a plug (not shown). A passivation layer 120 is then deposited on the whole semiconductor wafer 100, and a contact window 130 is opened over each bonding pad 110 by a traditional photolithography process and an etching process. A cleaning process is then performed.

Figure 4B:
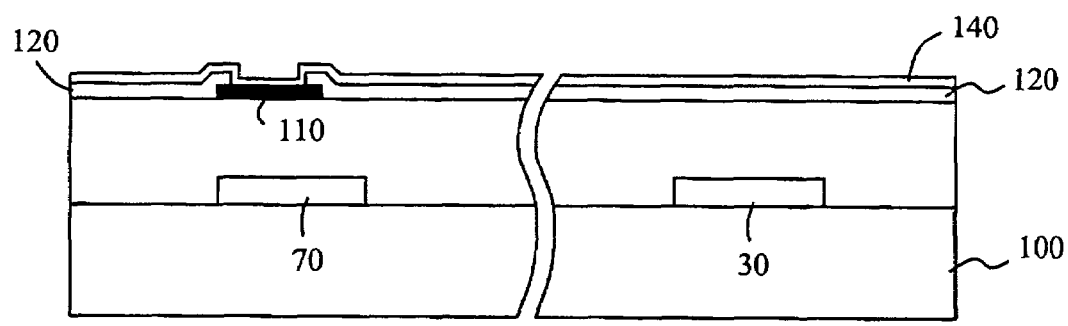

Referring next to FIG. 4B, a pad layer 140 is formed on the whole semiconductor wafer 100. According to one embodiment of the present invention, the pad layer 140 is optional. The pad layer 140 is made of TiW/Au with a thickness of between 1000 Å and 10000 Å, which is formed by a traditional sputter process, or other similar processes.

Figure 4C:
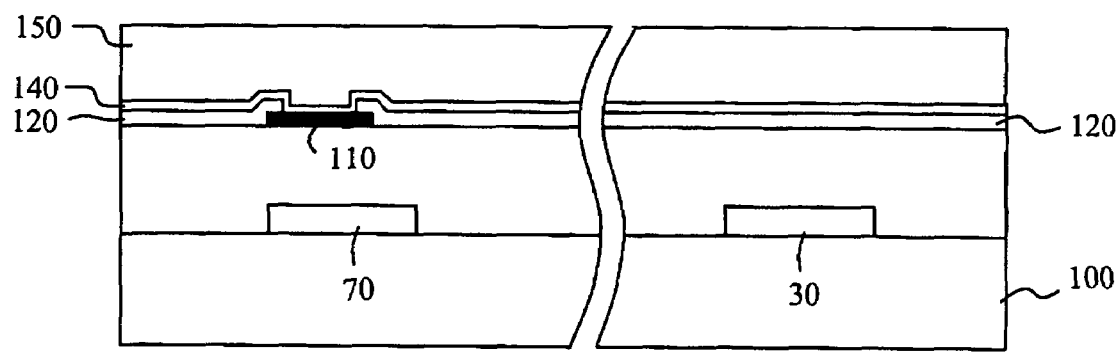

Referring then to FIG. 4C, a photo resist layer 150 is coated on the whole semiconductor wafer 100. The photo resist layer 150, which can be a positive type or a negative type, is formed to a thickness of between 2 μm and 4 μm by spin coating and then pre-baking at around 90° C.

Figure 4D:
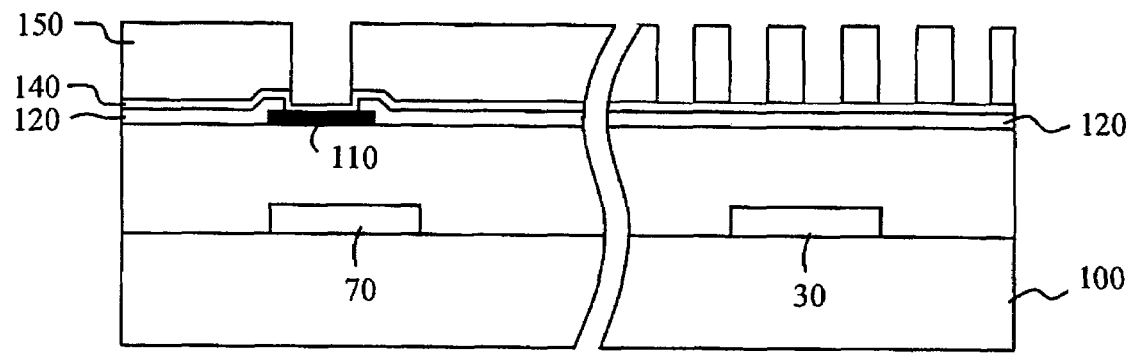

Referring now to FIG. 4D, the photo resist layer 150 is patterned by a conventional exposure process. The prior photo mask for the exposure process to form the gold bumps needs to add the pattern to form the current coil 20, in order that the current coil 20 can be fabricated together with the gold bumps. As shown in FIG. 4D, the opening 152 is applied to further form one of the gold bumps, and the opening 154 is also applied to form the current coil. After that, a conventional development process is performed by using an organic alkali solvent or the like. Thereafter, the residual photo resist 150 is post-baked.

Figure 4E:
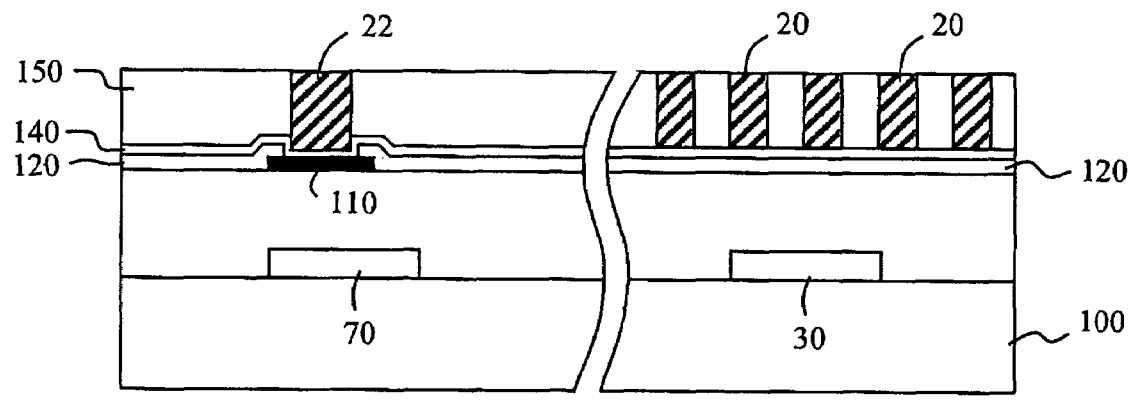

Referring now to FIG. 4E, the gold bump 22 and the current coil 20 are formed by a conventional electroplating process to a thickness of between 4 μm and 20 μm, using the residual photo resist 150 as mask. Because the current coil 20 is manufactured together with the gold bump 22, the current coil 20 is also made of gold, which is a metal with the lowest electric resistance. The low electric resistance of the current coil 20 means it has good electric conductivity and thus low voltage drop. Because a specific voltage drop will cause negative influence to especially low-voltage devices, the advantage of low voltage drop reveals its essentiality in case of low-voltage devices. The current coil 20 has also a thickness of between 4 μm and 20 μm. According to one embodiment of the present invention, the line width of the current coil 20 is between 10 μm and 20 μm, and the line spacing between adjacent lines of the current coil 20 is also between 10 μm and 20 μm.

Figure 4F:
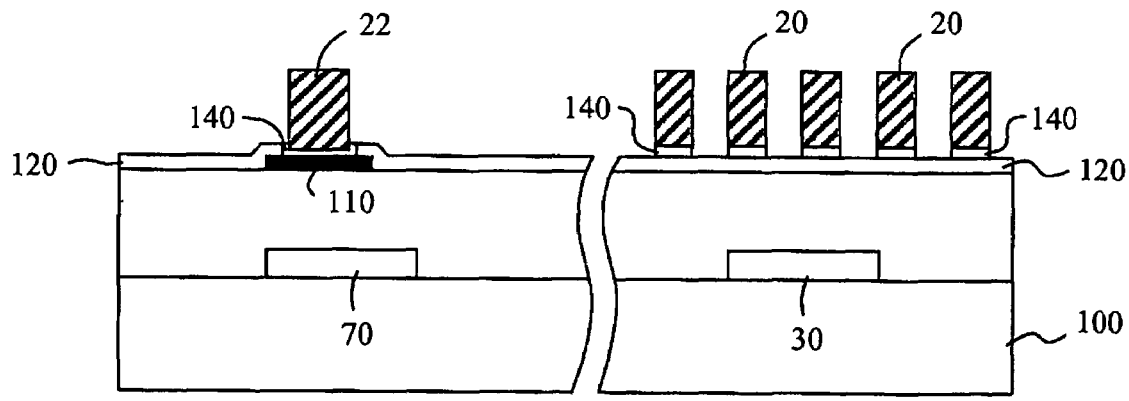

Referring then to FIG. 4F, the residual photo resist is removed by performing a traditional stripping process, and then the pad layer (not shown) under the residual photo resist is also removed by a conventional etching process. After finally performing an anneal process, the gold bumps 22 and the current coil 20 are formed together simultaneously.

According to one embodiment of the present invention, the anneal process is optional. In addition, the residual photo resist may be dissolved and removed by a remover containing diethylene glycol monobutyl ether and monoethanol amine as a base. The pad layer under the residual photo resist is selectively removed by ion beam etching while using the gold bumps 22 and the current coil 20 as masking material.

Realizations in accordance with the present invention therefore have been described in the context of particular embodiments. These embodiments are meant to be illustrative and not limiting. Many variations, modifications, additions, and improvements are possible. For example, plural instances may be provided for components described herein as a single instance. Additionally, structures and functionality presented as discrete components in the exemplary configurations may be implemented as a combined structure or component. These and other variations, modifications, additions, and improvements may fall within the scope of the invention as defined in the claims that follow.

What is claimed is:

1. A process of forming a CMOS power sensor, wherein said CMOS power sensor is applied to detect a power magnitude of a given voltage source, comprising:

providing a semiconductor wafer with a Hall device and at least one CMOS device, wherein on the top of said semiconductor wafer is a passivation layer which covers at least one bonding pad;

opening a contact window over said at least one bonding pad by performing a photolithography process and an etching process;

coating a photo resist layer on said semiconductor wafer;

patterning said photo resist layer by using a photo mask during an exposure process, wherein said photo mask comprises patterns for forming at least one gold bump and a current coil; wherein said current coil is connected to said voltage source and able to induce a magnetic field which can induce said Hall device to generate a Hall voltage; and Forming said at least one gold bump and said current coil by performing an electroplating process.

2. The process of claim 1, further comprising forming a pad layer on said semiconductor wafer after performing said step of opening a contact window over said at least one bonding pad.

3. The process of claim 2 further comprising:

removing a residual photo resist by performing a stripping process; and removing a part of said pad layer under said residual photo resist by performing an etching process.

4. The process of claim 3, further comprising performing an anneal process.

5. The process of claim 1, wherein said Hall device comprises:

a first terminal, which is connected to a high voltage device circuit;

a second terminal, which is connected to the ground;

a third terminal, which is connected to a first Hall probe; and a fourth terminal, which is connected to a second Hall probe.

6. The process of claim 5, wherein said Hall device is beneath said current coil, and said Hall device generates a Hall voltage in response to a magnetic field generated by said current coil.

7. The CMOS power sensor of claim 6, wherein said Hall voltage is a voltage difference between said first Hall probe and said second Hall probe.

8. The process of claim 1, wherein said current coil is made of gold having a thickness of between 4 μm and 20 μm.

* * * * *